US012580550B2

(12) United States Patent
Ando et al.

(10) Patent No.: US 12,580,550 B2
(45) Date of Patent: Mar. 17, 2026

(54) BULK ACOUSTIC WAVE FILTER CIRCUIT HAVING PHASE CANCELLING CIRCUIT

(71) Applicant: SKYWORKS SOLUTIONS, INC., Irvine, CA (US)

(72) Inventors: Yoshiaki Ando, Yokosuka (JP); Hiroyuki Nakamura, Osaka-Fu (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 174 days.

(21) Appl. No.: 18/533,457

(22) Filed: Dec. 8, 2023

(65) Prior Publication Data

US 2024/0204751 A1 Jun. 20, 2024

Related U.S. Application Data

(60) Provisional application No. 63/476,224, filed on Dec. 20, 2022.

(51) Int. Cl.
*H03H 9/56* (2006.01)
*H03H 9/54* (2006.01)

(52) U.S. Cl.
CPC ............ *H03H 9/568* (2013.01); *H03H 9/542* (2013.01)

(58) Field of Classification Search
CPC ......... H03H 9/542; H03H 9/568; H03H 9/605
See application file for complete search history.

(56) References Cited

U.S. PATENT DOCUMENTS

| | | | |
|---|---|---|---|
| 3,872,410 A | 3/1975 | Zucker | |
| 4,516,094 A | 5/1985 | Lee | |
| 4,799,029 A | 1/1989 | Minomo | |
| 4,906,885 A | 3/1990 | Kojima et al. | |
| 5,666,091 A | 9/1997 | Hikita et al. | |
| 5,682,126 A | 10/1997 | Plesski et al. | |
| 5,864,262 A | 1/1999 | Ikada | |
| 5,905,418 A | 5/1999 | Ehara et al. | |
| 5,994,980 A | 11/1999 | Tada | |

(Continued)

FOREIGN PATENT DOCUMENTS

| | | |
|---|---|---|
| EP | 2590326 A2 | 5/2013 |
| JP | S62261211 A | 11/1987 |

(Continued)

OTHER PUBLICATIONS

Lin et al., "Two-Port Filters and Resonators on ALN/3C-SIC Plates Utilizing High-Order Lamb Wave Modes", 2013 IEEE 26th International Conference on Micro Electro Mechanical Systems (MEMS), Taipei, 2013, pp. 789-792.

(Continued)

*Primary Examiner* — Quan Tra

(74) *Attorney, Agent, or Firm* — Lando & Anastasi, LLP

(57) ABSTRACT

Aspects and examples provide improvement in the attenuation level near the passband within the stopband of the bandpass-type filter using a ladder-type circuit. In one example the ladder-type circuit is formed from bulk acoustic wave resonators. A loop circuit is connected between two distinct points on a signal path extending from an input to an output of the ladder-type circuit for phase-cancellation of signals at the two distinct points. The two distinct points may be the input and the output of the ladder-type circuit. The loop circuit may include a coupled bulk acoustic wave resonator.

16 Claims, 9 Drawing Sheets

(56) References Cited

U.S. PATENT DOCUMENTS

| | | | |
|---|---|---|---|
| 6,049,260 | A | 4/2000 | Yoshimoto et al. |
| 6,262,637 | B1 | 7/2001 | Bradley et al. |
| 6,404,302 | B1 | 6/2002 | Satoh et al. |
| 6,462,633 | B1 | 10/2002 | Ichikawa |
| 6,677,835 | B2 | 1/2004 | Noguchi et al. |
| 6,707,352 | B2 | 3/2004 | Kawaguchi |
| 6,791,238 | B2 | 9/2004 | Kuratani et al. |
| 7,084,718 | B2 | 8/2006 | Nakamura et al. |
| 7,733,196 | B2 | 6/2010 | Tsurunari et al. |
| 7,941,103 | B2 | 5/2011 | Iwamoto et al. |
| 8,115,561 | B2 | 2/2012 | Tanaka |
| 8,174,339 | B2 | 5/2012 | Matsuda et al. |
| 8,228,137 | B2 | 7/2012 | Inoue et al. |
| 8,378,760 | B2 | 2/2013 | Iwaki et al. |
| 8,618,992 | B2 | 12/2013 | Fujiwara et al. |
| 8,970,320 | B2 | 3/2015 | Iwaki et al. |
| 9,118,303 | B2 | 8/2015 | Inoue |
| 9,219,467 | B2 | 12/2015 | Inoue et al. |
| 9,246,533 | B2 | 1/2016 | Fujiwara et al. |
| 9,299,914 | B2 | 3/2016 | Asai et al. |
| 9,520,857 | B2 | 12/2016 | Fujiwara et al. |
| 9,559,661 | B2 | 1/2017 | Inoue et al. |
| 9,780,759 | B2 | 10/2017 | Kimura et al. |
| 10,291,206 | B2 | 5/2019 | Irieda et al. |
| 10,404,234 | B2 | 9/2019 | Bi et al. |
| 10,476,482 | B2 | 11/2019 | Niwa et al. |
| 10,615,772 | B2 | 4/2020 | Yen |
| 10,727,812 | B2 | 7/2020 | Araki |
| 10,911,027 | B2 | 2/2021 | Nosaka |
| 11,038,487 | B2 | 6/2021 | Caron |
| 11,677,382 | B2 * | 6/2023 | Kameoka ............... H03H 9/706 |
| | | | 333/186 |
| 2004/0130411 | A1 | 7/2004 | Beaudin et al. |
| 2004/0246077 | A1 | 12/2004 | Misu et al. |
| 2007/0024392 | A1 | 2/2007 | Inoue et al. |
| 2007/0090895 | A1 | 4/2007 | Nishizawa et al. |
| 2008/0238572 | A1 | 10/2008 | Funami et al. |
| 2010/0026419 | A1 | 2/2010 | Hara et al. |
| 2010/0102901 | A1 | 4/2010 | Tsuda |
| 2010/0109802 | A1 | 5/2010 | Tanaka |
| 2010/0150075 | A1 | 6/2010 | Inoue et al. |
| 2010/0194494 | A1 | 8/2010 | Inoue et al. |
| 2011/0199169 | A1 | 8/2011 | Kadota |
| 2011/0254639 | A1 | 10/2011 | Tsutsumi et al. |
| 2012/0119847 | A1 | 5/2012 | Iwaki et al. |
| 2013/0113576 | A1 | 5/2013 | Inoue et al. |
| 2013/0147578 | A1 | 6/2013 | Hara et al. |
| 2013/0214873 | A1 | 8/2013 | Takamine |
| 2013/0271238 | A1 | 10/2013 | Onda et al. |
| 2014/0113571 | A1 | 4/2014 | Fujiwara et al. |
| 2015/0171827 | A1 | 6/2015 | Kawasaki |
| 2015/0341016 | A1 * | 11/2015 | Iwaki ................. H03H 9/02228 |
| | | | 333/133 |
| 2016/0105158 | A1 | 4/2016 | Fujiwara et al. |
| 2017/0093373 | A1 | 3/2017 | Fujiwara et al. |
| 2017/0099043 | A1 | 4/2017 | Goto et al. |
| 2017/0331456 | A1 | 11/2017 | Ono |
| 2018/0152191 | A1 * | 5/2018 | Niwa .................... H01P 1/2005 |
| 2020/0028487 | A1 * | 1/2020 | Caron ............... H03H 9/02228 |
| 2021/0226607 | A1 | 7/2021 | Caron |
| 2022/0247382 | A1 * | 8/2022 | Dyer ..................... H03H 9/568 |

FOREIGN PATENT DOCUMENTS

| | | | |
|---|---|---|---|
| JP | H0418806 | A | 1/1992 |
| JP | H08316773 | A | 11/1996 |
| JP | H09312587 | A | 12/1997 |
| JP | 2000286673 | A | 10/2000 |
| JP | 2002158599 | A | 5/2002 |
| JP | 2004242280 | A | 8/2004 |
| JP | 2006311041 | A | 11/2006 |
| JP | 2007124085 | A | 5/2007 |
| JP | 2010041141 | A | 2/2010 |
| JP | 2010154437 | A | 7/2010 |
| JP | 2010220163 | A | 9/2010 |
| JP | 2011160203 | A | 8/2011 |
| JP | 2012109818 | A | 6/2012 |
| JP | 2013-048491 | A | 3/2013 |
| JP | 2013118611 | A | 6/2013 |
| JP | 2013223025 | A | 10/2013 |
| JP | 2017220910 | A | 12/2017 |
| JP | 2018088678 | A | 6/2018 |
| WO | 0070758 | A1 | 11/2000 |
| WO | 0201715 | A1 | 1/2002 |
| WO | 2009025106 | A1 | 2/2009 |
| WO | 2010073377 | A1 | 7/2010 |

OTHER PUBLICATIONS

Yantchev et al., "Thin AlN Film Resonators utilizing the Lowest order Symmetric Lamb mode: Further Developments", Proceedings of the IEEE International Frequency Control Symposium and Exposition (2007), pp. 1067-1072.

Yen et al., "Fine Frequency Selection Techniques for Aluminum Nitride Lamb Wave Resonators", 2010 IEEE International Frequency Control Symposium, Newport Beach, CA, 2010, pp. 9-13.

Yen et al., "Synthesis of Narrowband AlN Lamb Wave Ladder-Type Filters Based on Overhang Adjustment", 2010 IEEE International Ultrasonics Symposium, San Diego, CA, 2010, pp. 970-973.

Zou, "High Quality Factor Lamb Wave Resonators", Technical Report No. UCB/EECS-2015-1, <http://www.eecs.berkeley.edu/Pubs/TechRpts/2015/EECS-2015-1.html>, Electrical Engineering and Computer Sciences University of California at Berkeley (2015).

* cited by examiner

BULK ACOUSTIC WAVE FILTER CIRCUIT HAVING PHASE CANCELLING CIRCUIT

CROSS-REFERENCE TO RELATED APPLICATIONS

This application claims priority under 35 U.S.C. § 119(e) to U.S. Provisional Patent Application Ser. No. 63/476,224, titled "BULK ACOUSTIC WAVE FILTER CIRCUIT HAVING PHASE CANCELLING CIRCUIT," filed Dec. 20, 2022, the entire content of which is incorporated herein by reference for all purposes.

BACKGROUND

Conventionally, in communication devices such as mobile phones, filtering devices are used to separate signals having different bands, such as a transmission signal and a reception signal. Bulk acoustic wave (BAW) resonators have been used for such filtering devices. The BAW resonators may include film bulk acoustic resonators (FBARs) and/or solidly mounted resonators (SMRs).

FIG. 1 is a circuit diagram showing an example of a conventional ladder-type bandpass filter formed by FBARs. A ladder-type filter 110 includes series-connected FBARs 111, 113, 115, 117 connected in series along a signal path extending from an input (IN) to an output (OUT). The ladder-type filter 110 further includes parallel-connected FBARs 112, 114, 116 connected between respective nodes interconnecting the series-connected FBARs 111, 113, 115, 117 and ground.

FIGS. 2A and 2B illustrate a configuration of a conventional electronic device in which the ladder-type filter 110 of FIG. 1 is formed. FIG. 2A is a plan view of the electronic device 100 and FIG. 2B is an end view of the electronic device. The plan view of FIG. 2A corresponds to a cross section taken along line II-II' in FIG. 2B.

In the electronic device 100, series-connected FBARs 111, 113, 115, 117 are disposed in series along a conductive signal path 131 extending from a first signal contact 141 to a second signal contact 143 on the top surface 151a of a piezoelectric substrate 151. The piezoelectric substrate 151 is supported by a support substrate 152. Further, parallel-connected FBARs 112, 114, 116 are connected between a ground plane 132 and respective nodes interconnecting the series-connected FBARs 111, 113, 115, 117 along the conductive signal path 131. The ground plane 132 connects the parallel-connected FBARS 112, 114, 116 to ground contacts 142, 144, 146.

The electronic device 100 includes a sealing substrate 153, which is disposed to oppose the top surface 151a of the piezoelectric substrate 151 via a certain gap. A side wall 154 formed along the outer periphery on the top surface 151a of the piezoelectric substrate 151 spaces the sealing substrate 153 apart from the piezoelectric substrate 151 and encloses the gap between the piezoelectric substrate 151 and the sealing substrate 153. As shown in the end view of FIG. 2B, external electrodes 155, 156 are disposed on the sealing substrate 153. The external electrodes 155, 156 are connected to suitable signal contacts 141, 143 or to ground contacts 142, 144, 146, 148 by vias (not shown), for example.

SUMMARY

Aspects and embodiments relate to filters including a ladder-type circuit formed using bulk acoustic wave resonators.

In the conventional ladder-type filter constructed from FBARs as shown in FIGS. 1 and 2A-B, design parameters are optimized between the series-connected FBARs 111, 113, 115, 117 and the parallel-connected FBARs 112, 114, 116 to reduce the loss in the filter's passband and improve the attenuation characteristics within the filter's stopband. However, it is common that there is a trade-off relationship between the passing characteristics and the attenuation characteristics of the filter, such that the attenuation characteristics near the passband are insufficient to provide desired performance.

In view of the above described circumstances, aspects and embodiments of the present invention provide a bandpass filter using a ladder-type circuit formed by BAW resonators, such as FBARs, to improve the attenuation level near the passband within the stopband.

According to one embodiment, a filter includes a ladder-type circuit formed by a plurality of bulk acoustic wave (BAW) resonators, and a loop circuit connected between two distinct points on a signal path extending from an input to an output of the ladder-type circuit for phase-cancellation of signals at the two distinct points.

The two distinct points may be the input and the output of the ladder-type circuit. The two distinct points may be the input of the ladder-type circuit and a node located one BAW resonator away from the output of the ladder-type circuit along the signal path, such that the one BAW resonator is connected in series between the node and the output of the ladder-type circuit.

The loop circuit may include a BAW resonator.

The BAW resonators forming the ladder-type circuit and the BAW resonator forming the loop circuit may be disposed on a common substrate. The BAW resonators may be film bulk acoustic resonators (FBARs) or solidly mounted resonators (SMRs).

According to the certain embodiments, the pass characteristics of the filter device can be ensured and the attenuation level near the passband within the stopband can be improved. Therefore, the separation characteristics and the isolation characteristics of the filter device can be improved.

According to one embodiment a filtering circuit comprises a ladder-type filter having an input and an output, the ladder-type filter including a plurality of series-arm acoustic wave resonators connected in series along a signal path between the input and the output, and a plurality of parallel-arm acoustic wave resonators connected between the signal path and a ground, and a loop circuit connected in parallel with the ladder-type filter between the input and output. The loop circuit includes a first capacitor connected to the input, a second capacitor connected to the output, and a coupled bulk acoustic wave resonator connected to the first and second capacitors and including a first acoustic wave element having a first signal terminal coupled to the first capacitor, a second acoustic wave element having second signal terminal coupled to the second capacitor, and a ground terminal, the coupled bulk acoustic wave resonator further including a piezoelectric film disposed between the first and second signal terminals and the ground terminal.

In another example each acoustic wave resonator is a bulk acoustic wave resonator, such as a film bulk acoustic resonator or a solidly mounted resonator.

In another example, the first and second acoustic wave elements of the coupled bulk acoustic wave resonator are film bulk acoustic wave resonators.

In another example each series-arm acoustic wave element and each parallel-arm acoustic wave element is a bulk acoustic wave element, such as a film bulk acoustic resonator or a solidly mounted resonator.

In another example, the first capacitor is formed integral with the coupled bulk acoustic wave resonator.

In another example, the first capacitor is formed from a portion of a conductive trace forming an upper electrode of the first acoustic wave element and a lower plate separated from the conductive trace by a layer of dielectric material.

In another example, the second capacitor is formed from a portion of a conductive trace forming an upper electrode of the second acoustic wave element and a lower plate separated from the conductive trace by a layer of dielectric material.

Another embodiment is directed to a filtering circuit comprising a ladder-type filter including a plurality of series-arm acoustic wave resonators connected in series along a signal path between an input and an output, the ladder-type filter further including a plurality of parallel-arm acoustic wave resonators connected between the signal path and a ground, and a loop circuit including a first capacitor, a second capacitor, and an acoustic wave filter connected in series between the first capacitor and the second capacitor, the first capacitor being connected to the input, and the second capacitor being connected to a node along the signal path, a first parallel-arm acoustic wave resonator of the plurality of parallel-arm acoustic wave resonators being connected between the node and the ground, and a single series-arm acoustic wave resonator of the plurality of series-arm acoustic wave resonators being connected between the node and the output. The acoustic wave filter includes a coupled bulk acoustic wave resonator connected between the first and second capacitors and including a first acoustic wave element having a first signal terminal coupled to the first capacitor, a second acoustic wave element having second signal terminal coupled to the second capacitor, and a ground terminal, the coupled bulk acoustic wave resonator further including a piezoelectric film disposed between the first and second signal terminals and the ground terminal.

In one example each series-arm acoustic wave resonator and each parallel-arm acoustic wave resonator is a bulk acoustic wave resonator, such as a film bulk acoustic resonator or a solidly mounted resonator.

In another example each of the first and second acoustic wave elements of the loop circuit is a bulk acoustic wave element. Each bulk acoustic wave element may be a film bulk acoustic resonator or a solidly mounted resonator.

In another example, the first capacitor is formed integral with the coupled bulk acoustic wave resonator.

In another example, the first capacitor is formed from a portion of a conductive trace forming an upper electrode of the first acoustic wave element and a lower plate separated from the conductive trace by a layer of dielectric material.

In another example, the second capacitor is formed integral with the coupled bulk acoustic wave resonator.

In another example, the second capacitor is formed from a portion of a conductive trace forming an upper electrode of the second acoustic wave element and a lower plate separated from the conductive trace by a layer of dielectric material.

According to another embodiment a filtering circuit comprises a primary filter and a loop circuit. The primary filter includes a plurality of primary acoustic wave elements constructed and arranged to provide the primary filter with a passband and a stopband, the plurality of primary acoustic wave elements including a plurality of series-arm acoustic wave resonators connected in series along a signal path between an input of the filtering circuit and an output of the filtering circuit, and a plurality of parallel-arm acoustic wave resonators connected between the signal path and a ground. The loop circuit includes a first capacitor, a second capacitor, and an acoustic wave filter connected in series between the first capacitor and the second capacitor, the first capacitor being connected to a first node of the primary filter, the second capacitor being connected to a second node of the primary filter that is different than the first node. The acoustic wave filter includes a coupled bulk acoustic wave resonator connected between the first and second capacitors and including a first acoustic wave element having a first signal terminal coupled to the first capacitor, a second acoustic wave element having second signal terminal coupled to the second capacitor, and a ground terminal, the coupled bulk acoustic wave resonator further including a piezoelectric film disposed between the first and second signal terminals and the ground terminal, the loop circuit being configured to attenuate a portion of a signal in the stopband of the primary filter by signal phase cancellation.

In one example the first node is the input of the primary filter and the second node is the output of the primary filter.

In another example the first node is the input of the primary filter, a first parallel-arm acoustic wave element of the plurality of parallel-arm acoustic wave resonators is connected between the second node and the ground, and at least one series-arm acoustic wave resonator of the plurality of series-arm acoustic wave resonators is connected between the second node and the output of the primary filter.

In one example each of the primary acoustic wave resonators is one of a film bulk acoustic resonator and a solidly mounted resonator.

In one example the secondary acoustic wave filter includes a first secondary acoustic wave element connected to the first capacitor and a second secondary acoustic wave element connected to the second capacitor.

In one example the first node includes the first signal contact and the second node includes the second signal contact.

In another example at least one of the plurality of primary series-arm acoustic wave elements is connected along the conductive track between the first node and the second node.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

5

Figure 1:
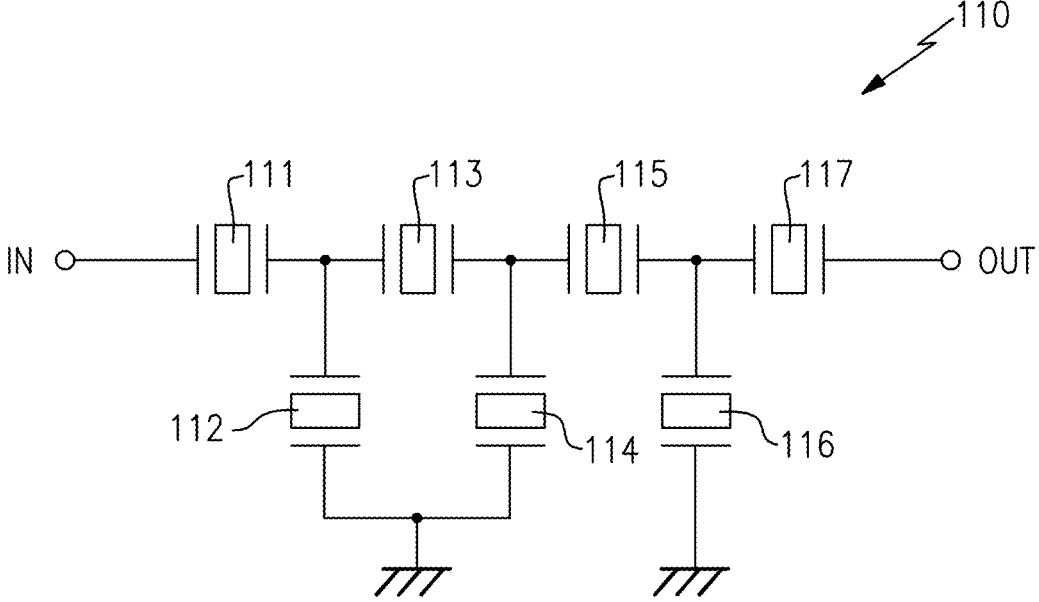
Figure 2A:
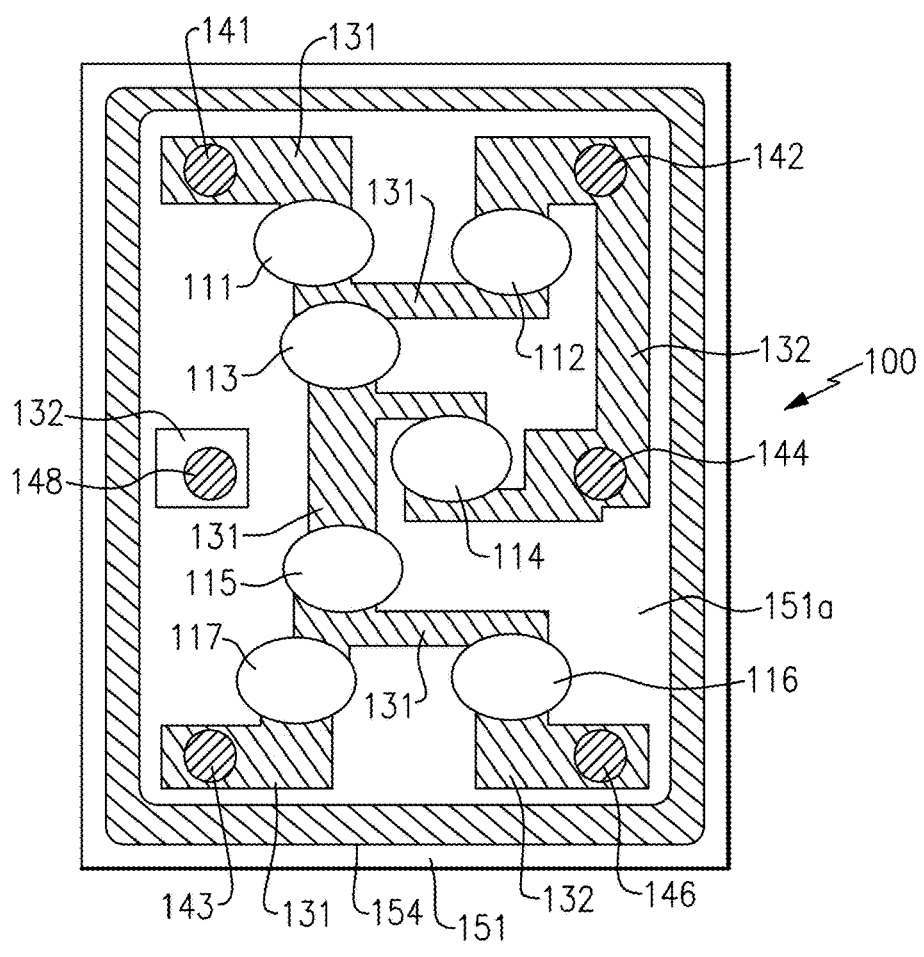
Figure 2B:
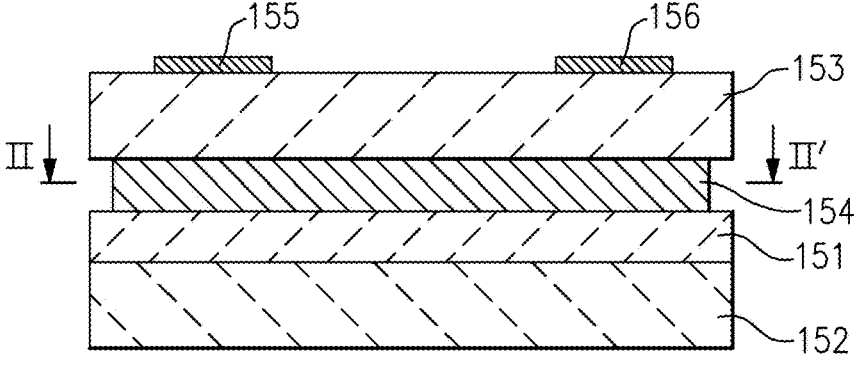
Figure 3:
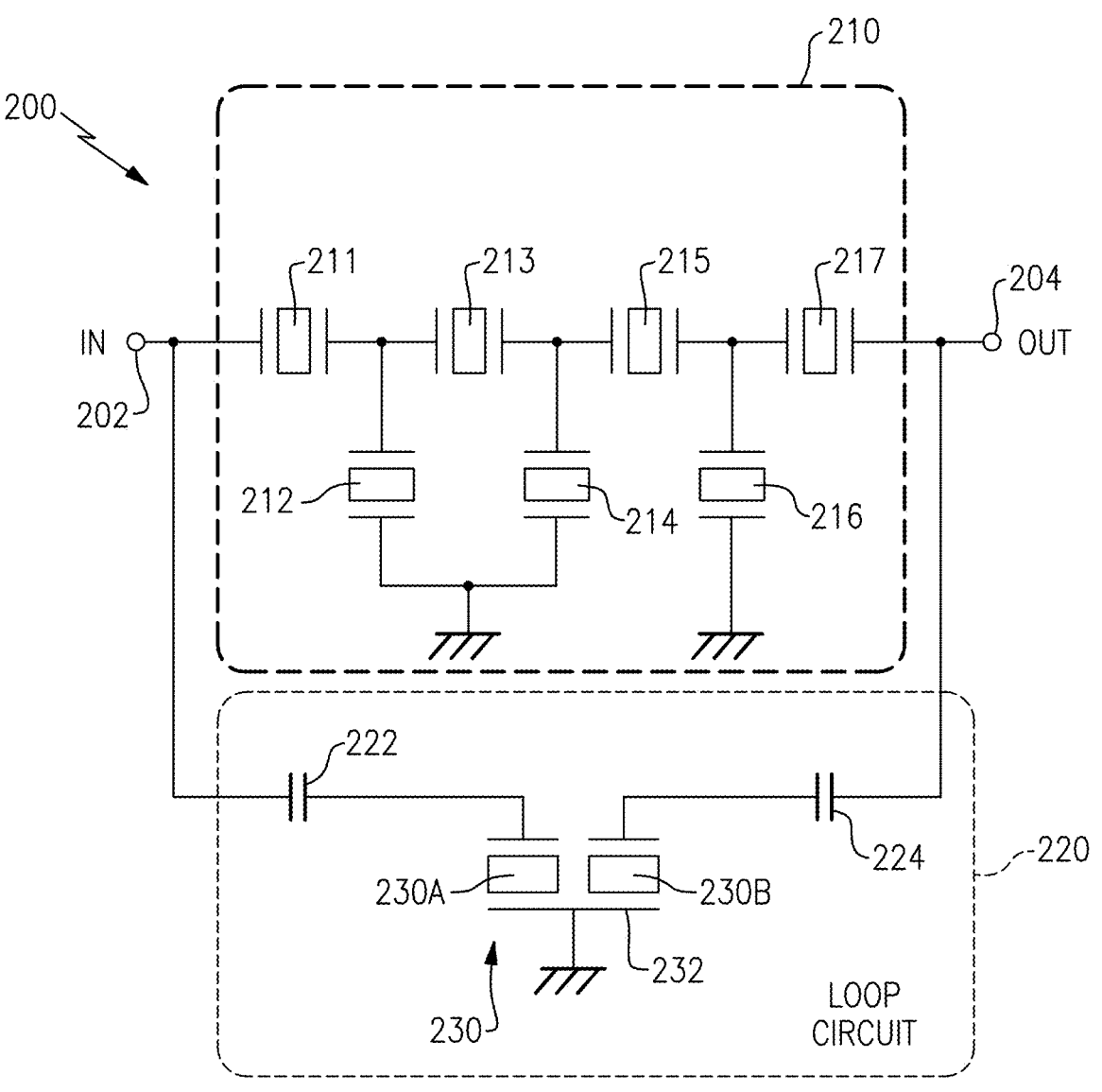
Figure 4A:
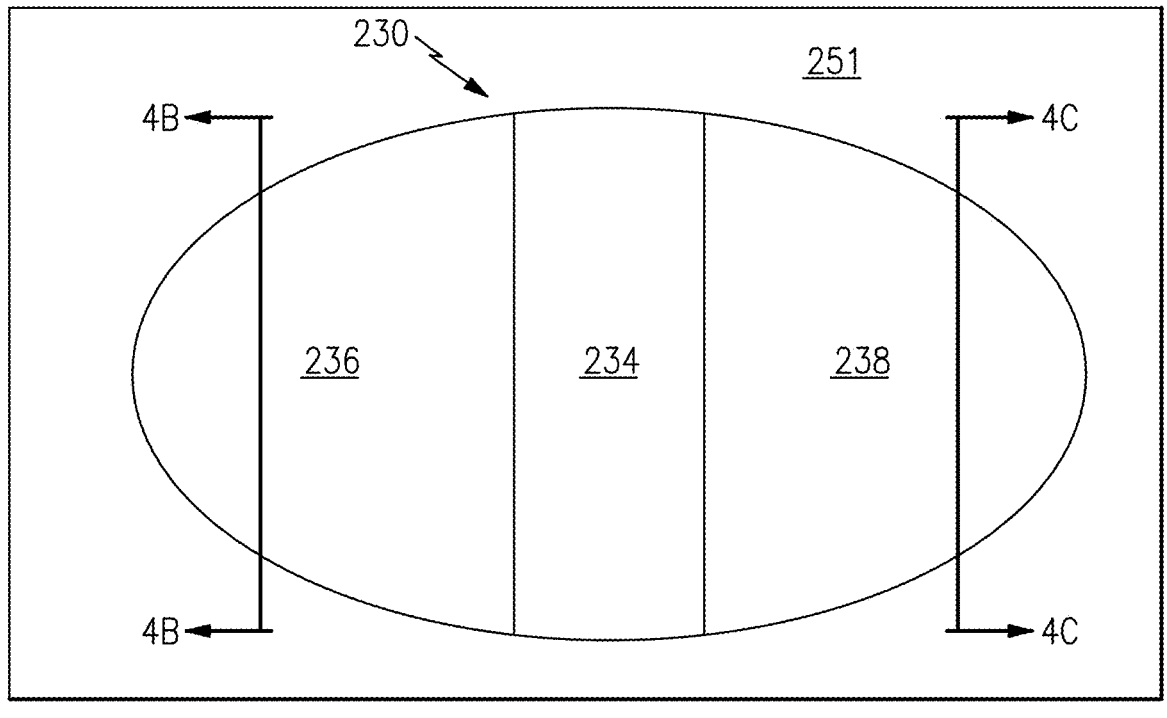
Figure 4B:
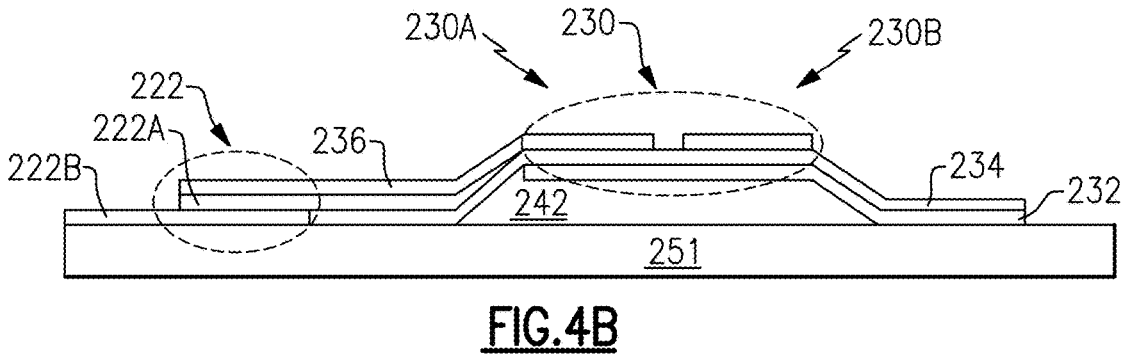
Figure 4C:
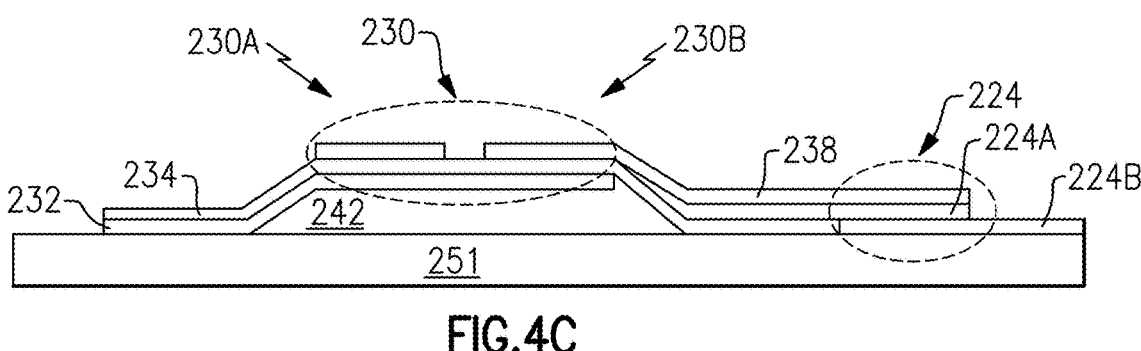
Figure 5:
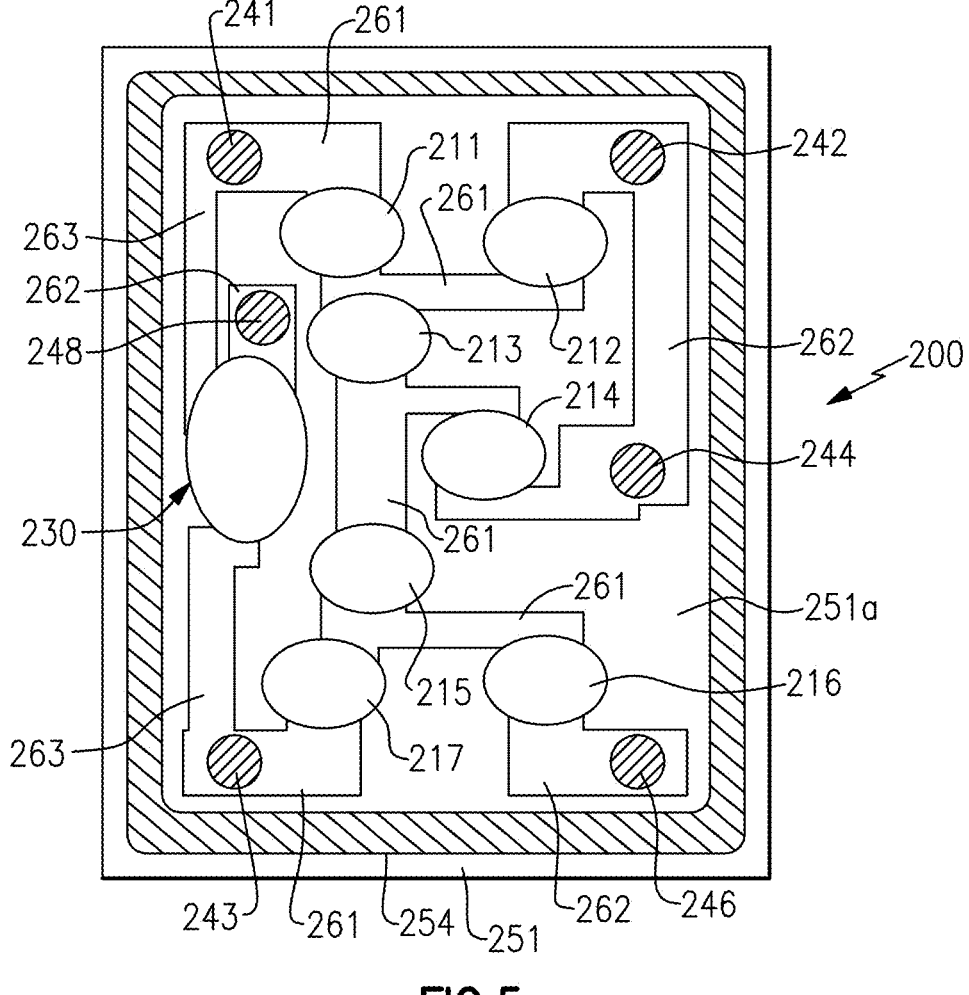
Figure 6:
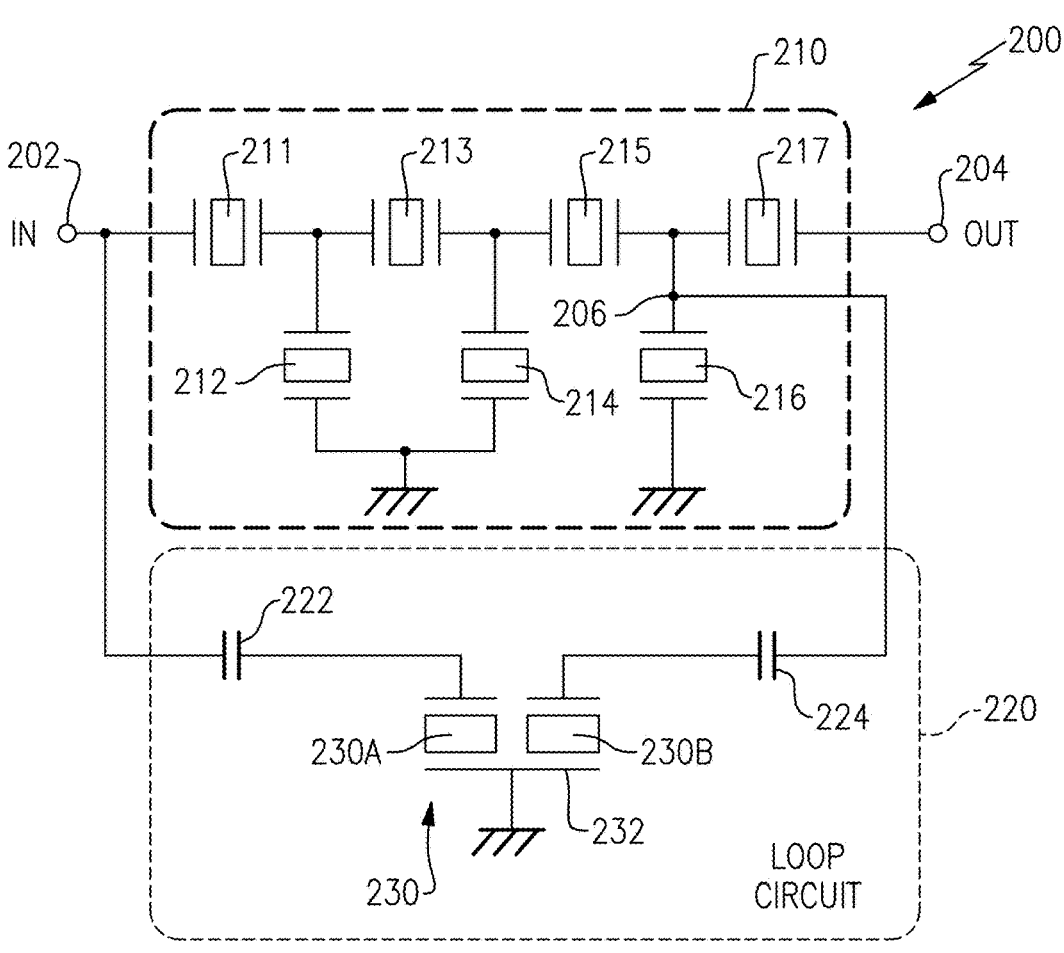
Figure 7:
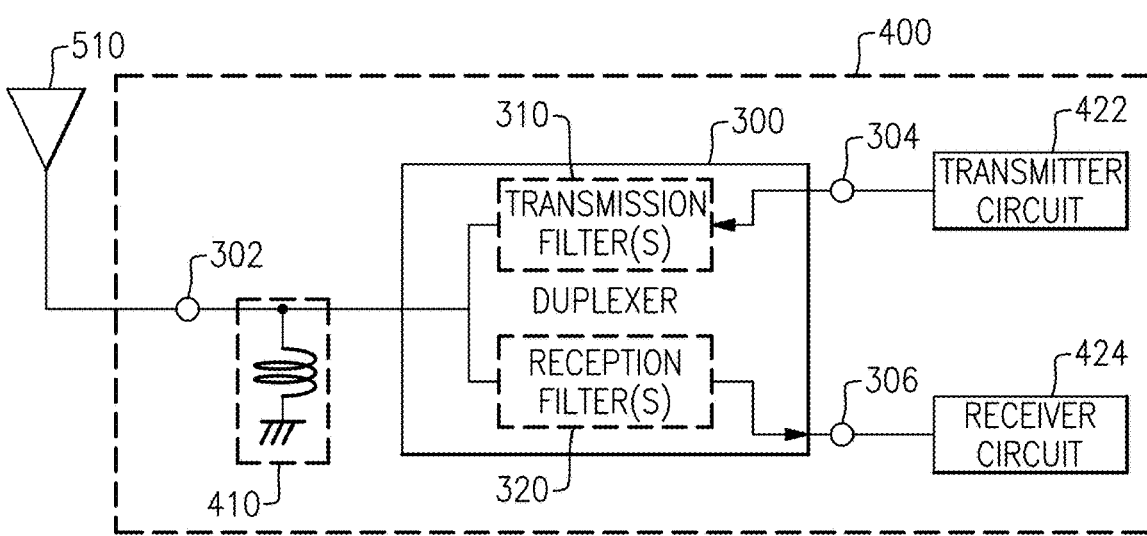
Figure 8:
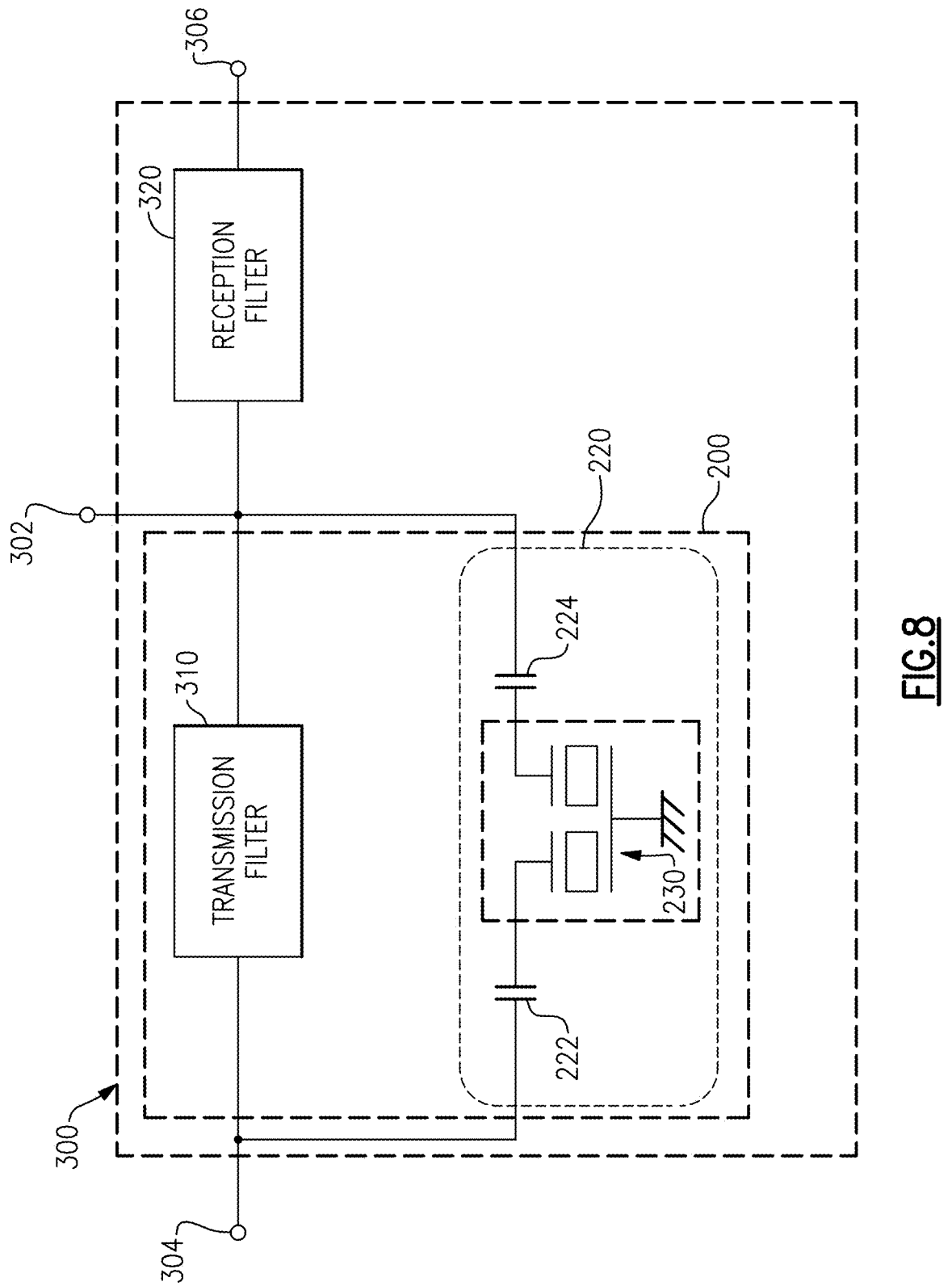
Figure 9:
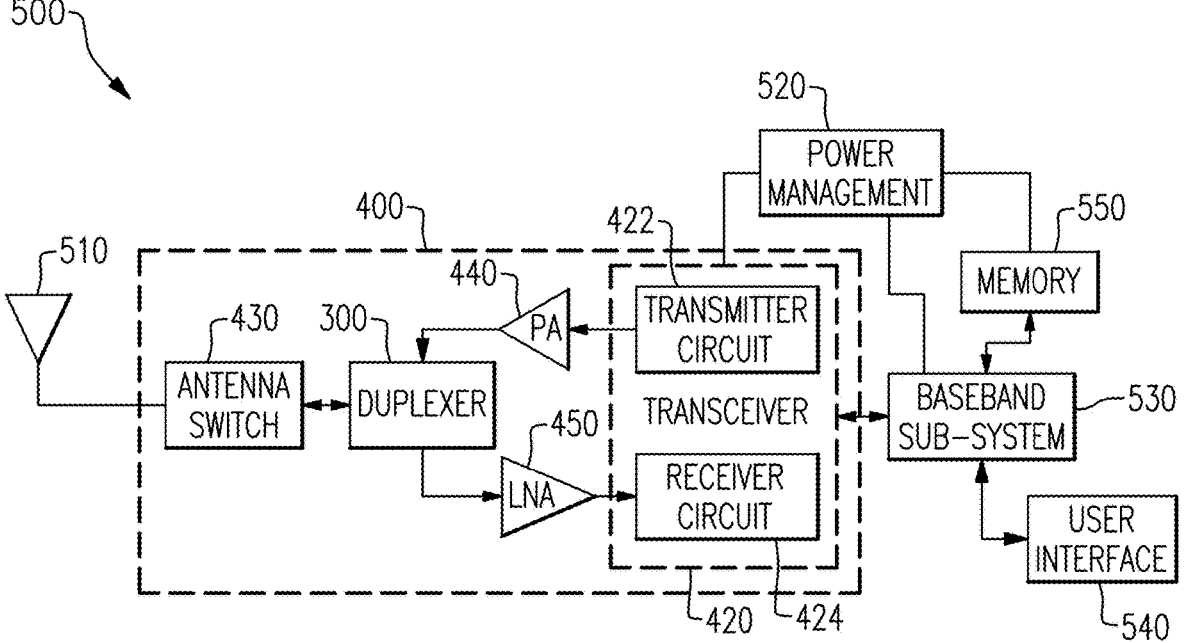

FIG. 1 is a circuit diagram showing a configuration of a conventional ladder-type filter using FBARs;

FIG. 2A is a plan view of a conventional electronic device including a ladder-type filter formed using FBARs;

FIG. 2B is an end view of the conventional electronic device of FIG. 2A;

FIG. 3 is a circuit diagram showing a configuration of a filter according to one embodiment;

FIG. 4A is a top view of one example of a coupled bulk acoustic wave (BAW) resonator utilized in the loop circuit of the filter of FIG. 3 according to certain aspects;

FIG. 4B is a partial cross-sectional view of the coupled BAW resonator shown in FIG. 4A along line 4B-4B of FIG. 4A;

FIG. 4C is a partial cross-sectional view of the coupled BAW resonator shown in FIG. 4A along line 4C-4C of FIG. 4A;

FIG. 5 plan view of an electronic device including a ladder-type filter formed using FBARs and a loop circuit including a coupled BAW resonator as disclosed herein;

FIG. 6 is a circuit diagram showing another example of a filter according to certain aspects;

FIG. 7 is a block diagram of one example of a front end module in which filters according to certain embodiments can be used;

FIG. 8 is block diagram of one example of an antenna duplexer that can be used in the front end module of FIG. 7 according to certain aspects; and FIG. 9 is a block diagram of one example of a wireless device in which filters according to certain embodiments can be used.

DETAILED DESCRIPTION

Various aspects and examples of filters according to embodiments of the present invention are described below in detail with reference to the drawings.

FIG. 3 is a circuit diagram showing a filter according to one embodiment. In this embodiment film bulk acoustic resonators (FBARs) are used for bulk acoustic wave (BAW) resonators forming the filter. As shown in FIG. 3, the filter 200 according to one embodiment includes a ladder-type filter circuit 210 formed by FBARs and disposed between an input (IN) 202 and an output (OUT) 204. Further, a loop circuit 220 is disposed between the input 202 and the output 204, connected in parallel with the ladder-type filter circuit 210.

In the ladder-type filter circuit 210, series-connected FBARs 211, 213, 215, 217 are connected in series along a signal path extending from the input 202 to the output 204. Further, parallel-connected FBARs 212, 214, 216 are connected between respective nodes interconnecting the series-connected FBARs 211, 213, 215, 217 and ground. In this example, each of the parallel-connected FBARs 212, 214 is connected at one end to the ground through a common node, as shown in FIG. 3.

The loop circuit 220 includes a coupled BAW resonator 230. In one example, the coupled BAW resonator includes a first acoustic wave element 230A connected to the input 202 and a second acoustic wave element 230B connected to the output 204. The first acoustic wave element 230A and the second acoustic wave element 230B share a piezoelectric film and a ground (bottom) electrode, but have different signal (top) electrodes, as will be described in further detail below. The first acoustic wave element 230A and the second acoustic wave element 230B are arranged adjacent to each other to form the coupled BAW resonator 230 such that the directions from the signal electrodes to the ground electrode of the acoustic wave elements 230A, 230B can be oriented the same.

Further, the loop circuit 220 includes a first capacitor 222 disposed between the input 202 and the coupled BAW resonator 230, specifically, between the input 202 and the first acoustic wave element 230A. Still further, the loop circuit 220 includes a second capacitor 224 disposed between the coupled BAW resonator 230 and the output 204, specifically, between the second acoustic wave element 230B and the output 204.

FIG. 4A is a plan view of one example of the coupled BAW resonator 230 of FIG. 3. The coupled BAW resonator 230 includes substrate 251 upon which is disposed a piezoelectric film 234 made of piezoelectric material such as aluminum nitride (AlN) or zinc oxide (ZnO). The piezoelectric film 234 is partially covered by a top electrode 236 of the first acoustic wave element 230a and partially covered by a top electrode 238 of the second acoustic wave element 230b.

As illustrated in the cross-sectional view of FIG. 4B through line 4B-4B of FIG. 4A, the coupled BAW resonator 230 has an FBAR structure including a layer of piezoelectric material 234, a lower electrode 232, and two upper electrodes which define the locations of the first acoustic wave element 230A and the second acoustic wave element 230B. In FIG. 4B the conductive trace, e.g., metal line 236 electrically connected to and forming the upper electrode for the first acoustic wave element 230A is shown extending outward from the central region of the device. Conductive trace 236 electrically connects to the IN terminal 202 of FIG. 3. The capacitor 222 is defined by a portion of the conductive trace 236 and a lower capacitor plate 222B separated from the conductive trace 236 by a layer of dielectric material 222A, for example, silicon dioxide. The electrical connection to the lower capacitive plate 222B is not illustrated in the interest of clarity. The lower capacitive plate 222B may in some embodiments abut an end of the layer of piezoelectric material 234 on the upper surface of the substrate 251 as illustrated, or may be displaced from the end of the layer of piezoelectric material 234. In the central region of the coupled BAW resonator 230, the lower electrode 232 and piezoelectric film 234 are spaced away from the upper surface of the substrate 251 and define a cavity 242 which allows the piezoelectric film 234 to vibrate.

FIG. 4C illustrates a cross-section of the coupled BAW resonator 230 through line 4C-4C of FIG. 4A. FIG. 4C is substantially the same as FIG. 4B except in FIG. 4C, the conductive trace, e.g., metal line 238 electrically connected to and forming the upper electrode for the second acoustic wave element 230B is shown extending outward from the central region of the device. Conductive trace 238 electrically connects to the OUT terminal 204 of FIG. 3. The capacitor 224 is defined by a portion of the conductive trace 238 and a lower capacitor plate 224B separated from the conductive trace 238 by a layer of dielectric material 224A, for example, silicon dioxide. The electrical connection to the lower capacitive plate 224B is not illustrated in the interest of clarity. The lower capacitive plate 224B may in some embodiments abut an end of the layer of piezoelectric material 234 on the upper surface of the substrate 251 as illustrated, or may be displaced from the end of the layer of piezoelectric material 234.

The ladder-type filter circuit 210 and the loop circuit 220 may both be formed on a flat top surface 251a of the same substrate 251, for example, as illustrated in FIG. 5. The substrate 251 may be or may include silicon, silicon dioxide, silicon nitride, alumina, sapphire, or any other substrate suitable for supporting acoustic wave resonators. In some embodiments, the resonators of the ladder-type filter circuit 210 and of the loop circuit 220 each include the same piezoelectric film 234 which is disposed on the top surface 251a of the substrate 251. A side wall 254 is formed along the outer periphery on the top surface 251a of the piezo-electric substrate 251 to enclose the electronic circuit of the filter 200. The series-connected FBARs 211, 213, 215, 217 of the ladder-type filter circuit 210 are disposed on the top surface 251a of the piezoelectric substrate 251 along a conductive signal track 261, which corresponds to a signal path extending from a signal contact 241 at the input 202 to a signal contact 243 at the output 204. Further, the parallel-connected FBARs 212, 214, 216 are formed along a ground track 262. The parallel-connected FBARs 212, 214, 216 connect nodes interconnecting the series-connected FBARs 211, 213, 215, 217 to respective ground contacts 242, 244, 246 via the ground track 262. In this example, the ground track 262 is connected between the parallel-connected FBARs 212 and 214 through the ground contacts 242 and 244.

The loop circuit 220 including the coupled BAW resona-tor 230 is formed along a loop signal track 263 extending from the signal contact 241 to the signal contact 243. The coupled BAW resonator 230 includes the first acoustic wave element 230A connected to the signal contact 241 and the second acoustic wave element 230B connected to the signal contact 243. The lower ground electrode 232 of the coupled BAW resonator 230 is connected to a ground contact 248 via the ground track 262. The lower plates 222B, 224B of the capacitors 222, 224 may also be electrically connected to the ground contact 248 via the ground track 262.

The first capacitor 222 is illustrated as being integral to the couped BAW resonator 230 in FIG. 4B, but alternatively may be disposed on the loop signal track 263 connecting the signal contact 241 to the coupled BAW resonator 230. Further, the second capacitor 224 is also illustrated as being integral to the coupled BAW resonator 230 in FIG. 4C, but alternatively may be disposed on the loop signal track 263 connecting the SAW filter 230 to the signal contact 243.

The filter 200 according to certain embodiments includes the loop circuit 220 connected between the input 202 and the output 204 and connected in parallel with the ladder-type filter circuit 210 to enable phase-cancellation of signals between the input and the output. The filter 200 according to these embodiments allows the design parameters of the loop circuit 220 to be optimized such that the loss in the passband can be minimized and the attenuation characteristics within the stopband and near the passband can be improved.

Further, according to certain embodiments, the ladder-type filter circuit 210 including the FBARs 211-217 and the loop circuit 220 including the coupled BAW resonator 230 are disposed on a common support substrate 251, as shown in FIG. 5. Therefore, the filter 200 can be downsized.

FIG. 6 is a circuit diagram showing another example of the filter 200 according to certain embodiments. In this example of the filter 200, the loop circuit 220 is connected between the input 202 of the filter and a node located between two FBARs of the ladder-type filter circuit 210. In particular, in the example shown in FIG. 6, the loop circuit 220 is connected at a node 206 located between the series-connected FBAR 217 disposed closest to the output 204 and the preceding series-connected FBAR 215 along the signal path. Thus, the series-connected FBAR 217 is located between the node 206 connected to the loop circuit 220 and the output 204 along the signal path. This is different from the arrangement shown in FIG. 3 in which the loop circuit 220 is connected between the input 202 and the output 204.

In the example shown in FIG. 6, the ladder-type filter circuit 210 formed by FBARs is disposed between the input 202 and the output 204. As discussed above, the series-connected FBARs 211, 213, 215, 217 are connected in series along the signal path in the ladder-type filter circuit 210. Further, the parallel-connected FBARs 212, 214, 216 are connected in parallel between respective nodes intercon-necting the series-connected FBARs 211, 213, 215, 217 and the ground. In the example shown in FIG. 6, each of the FBARs 212 and 214 is connected at one end to the ground through a common node.

As discussed above, in the example shown in FIG. 6, the loop circuit 220 is connected between the input 202 and a node 206 interconnecting the series-connected FBARs 215, 217 with the parallel-connected FBAR 216. In other words, the loop circuit 220 is connected between the input of the ladder-type filter circuit 210 and a node positioned one FBAR away from the output along the signal path between the input 202 and the output 204.

The loop circuit 220 includes the coupled BAW resonator 230. The coupled BAW resonator 230 includes the first acoustic wave element 230A connected to the input 202 of the ladder-type filter circuit 210 and the second acoustic wave element 230B connected to the node 206 intercon-necting the series-connected FBARs 215, 217 with the parallel-connected FBAR 216. The first acoustic wave ele-ment 230A and the second acoustic wave element 230B are arranged adjacent to each other and share a lower ground electrode 232 and piezoelectric film 234 to form the coupled BAW resonator 230 such that the directions from the respec-tive upper signal electrodes to the lower ground electrode 232 can be oriented the same.

Further, the loop circuit 220 includes the first capacitor 222 integrated into the coupled BAW resonator 230 or connected between the input 202 and the coupled BAW resonator 230. Still further, the loop circuit 220 includes the second capacitor 224 integrated into the coupled BAW resonator 230 or connected between the coupled BAW resonator 230 and the node 206.

As discussed above, in the example of the filter 200 shown in FIG. 6, the loop circuit 220 is connected between the input 202 of the ladder-type filter circuit 210 and the node 206 interconnecting the series-connected FBARs 215, 217 with the parallel-connected FBAR 216. With this arrangement, variations in the output impedance can be suppressed and the attenuation characteristics within the stopband can be improved.

It is to be appreciated that although the example of the filter 200 shown in FIG. 6 has a configuration in which the loop circuit 220 is connected between the input 202 and a node 206 located one resonator away from the output 204 along the signal path, other embodiments of the filter 200 are not limited to this configuration. For example, the loop circuit 220 can be connected between a node located one resonator way from the input 202 of the ladder-type filter circuit 210 along the signal path and the output 204 of the ladder-type filter circuit 210. Further, the loop circuit 220 may be connected between two distinct points selected from the input 202 and the output 204 of the ladder-type filter circuit 210 as well as respective nodes interconnecting the series-connected FBARs 211, 213, 215, 217 along the signal path of the ladder-type filter circuit 210.

It is to be appreciated that although in various embodi-ments disclosed herein, the BAW resonators have been described as FBARs, other embodiments of the filter 200 are not limited thereto. For example, another BAW resonator, such as solidly mounted resonator (SMR), can be used as a BAW resonator forming the ladder-type filter circuit 210 and/or the loop circuit 220 of the filter 200 according to various embodiments.

Embodiments of the filter 200 can be used in a wide variety of electronic devices and components. For example, embodiments of the filter 200 can be used in a diplexer, triplexer, or antenna duplexer. When the filter 200 is used in an antenna duplexer, as either a transmission filter or a reception filter, the loop circuit 220 can be used to improve the isolation characteristic of the duplexer.

Referring to FIG. 7 there is illustrated a block diagram of one example of a front-end module 400, which may be used in an electronic device such as a wireless communications device (e.g., a mobile phone) for example, and which includes an antenna duplexer 300. The antenna duplexer 300 has a common terminal 302, an input terminal 304, and an output terminal 306. An antenna 510 is connected to the common terminal 302. In certain examples, a phase matching component 410, such as an inductor, can be connected to the common terminal 302, as shown. The front-end module 400 further includes a transmitter circuit 422 connected to the input terminal 304 of the duplexer 300 and a receiver circuit 424 connected to the output terminal 306 of the duplexer 300. The transmitter circuit 422 can generate signals for transmission via the antenna 510, and the receiver circuit 424 can receive and process signals received via the antenna 510. In some embodiments such reception and transmission functionalities can be implemented in separate components, as illustrated in FIG. 7, or in a common transceiver circuit/module, as discussed further below. As will be appreciated by those skilled in the art, given the benefit of this disclosure, the front-end module 400 may include other components, not illustrated, such as, but not limited to, switches, electromagnetic couplers, amplifiers, processors, and the like.

The antenna duplexer 300 may include one or more transmission filters 310 connected between the input terminal 304 and the common terminal 302, and one or more reception filters 320 connected between the common terminal 302 and the output terminal 306. The isolation characteristic of the duplexer 300 refers to the passing characteristic from the input terminal 304 to the output terminal 306. An improved isolation characteristic can be obtained in the passbands of the filters 310 and 320 by reducing a level of signal that passes between the input terminal 304 and the output terminal 306. As discussed above, one manner by which this can be achieved is to improve signal attenuation in the stopband(s) of at least one of the filters 310 or 320. According to certain embodiments, to assist in achieving this improved isolation characteristic, any one or more of the transmission filters 310, reception filters 320, or a combination thereof, can be implemented using embodiments of the filter 200 including the phase loop circuit 220 discussed above. In particular, where the loop circuit 220 is used in combination with a transmission filter 310 that is a bandpass filter (and therefore may have more than one stopband), the loop circuit can be configured to improve attenuation in a stopband of the transmission filter 310 that overlaps in frequency with the passband of one or more of the reception filter(s) 320. Similarly, where the loop circuit 220 is used in combination with a reception filter 320 that is a bandpass filter, the loop circuit can be configured to improve attenuation in a stopband of the reception filter 310 that overlaps in frequency with the passband of one or more of the transmission filter(s) 310.

FIG. 8 is a diagram of an example of the antenna duplexer 300 including an embodiment of the filter 200 configured to implement the transmission filter 310. Thus, an example of the loop circuit 220 is connected in parallel with the transmission filter 310 between the input terminal 304 and the common terminal 302. In one example the transmission filter 310 has the configuration of the ladder-type filter circuit 210 shown in FIGS. 3 and 6. In the example shown in FIG. 8, the transmission filter 310 is implemented using an embodiment of the filter 200; however, in other examples, the reception filter 320 can be implemented using an embodiment of the filter 200. In such an example, the loop circuit 220 can be connected in parallel with the reception filter 320 between the common terminal 302 and the output terminal 306. In other examples, both the transmission filter 310 and the reception filter 320 can be implemented using embodiments of the filter 200.

Embodiments of the antenna duplexer 300 or front end module 400 including embodiments of the filter 200 discussed above may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), an appliance, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a wrist watch, a clock, etc. Further, the electronic devices can include unfinished products.

FIG. 9 is a block diagram of one example of a wireless device 500 including the antenna duplexer 300, which as discussed above may be implemented using one or more embodiments of the filter 200 including the loop circuit 220. The wireless device 500 can be a cellular phone, smart phone, tablet, modem, communication network or any other portable or non-portable device configured for voice or data communication. The wireless device 500 can receive and transmit signals from the antenna 510. The wireless device 500 includes the front-end module 400, which includes the duplexer 300 as discussed above. The front-end module 400 further includes an antenna switch 430, which can be configured to switch between different frequency bands or modes, such as transmit and receive modes, for example. In the example illustrated in FIG. 9, the antenna switch 430 is positioned between the duplexer 300 and the antenna 510; however, in other examples the duplexer 300 can be positioned between the antenna switch 430 and the antenna 510, or the antenna switch 430 and the duplexer 300 can be integrated into a single module.

The front end module 400 includes a transceiver 420 that is configured to generate signals for transmission or to process received signals. The transceiver 420 can include the transmitter circuit 422 which can be connected to the input terminal 304 of the duplexer 300, and the receiver circuit 424 which can be connected to the output terminal 306 of the duplexer 300, as shown in FIG. 7. Signals generated for transmission by the transmitter circuit 422 are received by a power amplifier (PA) module 440, which amplifies the generated signals from the transceiver 420. As will be appreciated by those skilled in the art, the power amplifier module 440 can include one or more power amplifiers. The power amplifier module 440 can be used to amplify a wide variety of RF or other frequency-band transmission signals. For example, the power amplifier module 440 can receive an enable signal that can be used to pulse the output of the power amplifier to aid in transmitting a wireless local area network (WLAN) signal or any other suitable pulsed signal. The power amplifier module 440 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 440 and associated components including switches and the like can be fabricated on GaAs substrates using, for example, pHEMT or BiFET transistors, or on a Silicon substrate using CMOS transistors. The front-end module 400 further includes a low noise amplifier module 450, which amplifies received signals from the antenna 510 and provides the amplified signals to the receiver circuit 424 of the transceiver 420.

The wireless device 500 of FIG. 9 further includes a power management sub-system 520 that is connected to the transceiver 420 and that manages the power for the operation of the wireless device. The power management system 520 can also control the operation of a baseband sub-system 530 and other components of the wireless device 500. The power management system 520 can include, or can be connected to, a battery (not shown) that supplies power for the various components of the wireless device 500. The power management system 520 can further include one or more processors or controllers that can control the transmission of signals, for example.

In one embodiment, the baseband sub-system 530 is connected to a user interface 540 to facilitate various input and output of voice or data provided to and received from the user. The baseband sub-system 530 can also be connected to a memory 550 that is configured to store data or instructions to facilitate the operation of the wireless device 500, or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, it is to be appreciated that embodiments discussed herein are not limited in application to the details of construction and the arrangement of components set forth in the description or illustrated in the accompanying drawings. The devices disclosed herein are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Accordingly, the foregoing description and drawings are by way of example only, and the scope of the invention should be determined from proper construction of the appended claims, and their equivalents.

What is claimed is:

1. A filtering circuit comprising:
   a ladder-type filter having an input and an output, the ladder-type filter including a plurality of series-arm acoustic wave resonators connected in series along a signal path between the input and the output, and a plurality of parallel-arm acoustic wave resonators connected between the signal path and a ground; and
   a loop circuit connected in parallel with the ladder-type filter between the input and output, the loop circuit including a first capacitor connected to the input, a second capacitor connected to the output, and a coupled bulk acoustic wave resonator connected to the first and second capacitors and including a first acoustic wave element having a first signal terminal coupled to the first capacitor, a second acoustic wave element having second signal terminal coupled to the second capacitor, and a ground terminal, the coupled bulk acoustic wave resonator further including a piezoelectric film disposed between the first and second signal terminals and the ground terminal, the first capacitor being integrally formed with the coupled bulk acoustic wave resonator and including a portion of a conductive trace forming an upper electrode of the first acoustic wave element and a lower plate separated from the conductive trace by a layer of dielectric material, the lower plate being laterally displaced from the piezoelectric film.

2. The filtering circuit of claim 1 wherein each acoustic wave resonator is a film bulk acoustic wave resonator.

3. The filtering circuit of claim 1 wherein each acoustic wave resonator is a solidly mounted resonator.

4. The filtering circuit of claim 1 wherein the first and second acoustic wave elements of the coupled bulk acoustic wave resonator are film bulk acoustic wave resonators.

5. The filtering circuit of claim 1 wherein the second capacitor is integrally formed with the coupled bulk acoustic wave resonator.

6. The filtering circuit of claim 5 wherein the second capacitor is formed from a portion of a conductive trace forming an upper electrode of the second acoustic wave element and a lower plate separated from the conductive trace by a layer of dielectric material.

7. A filtering circuit comprising:
   a ladder-type filter including a plurality of series-arm acoustic wave resonators connected in series along a signal path between an input and an output, the ladder-type filter further including a plurality of parallel-arm acoustic wave resonators connected between the signal path and a ground; and
   a loop circuit including a first capacitor, a second capacitor, and an acoustic wave filter connected in series between the first capacitor and the second capacitor, the first capacitor connected to the input, and the second capacitor connected to a node along the signal path, a first parallel-arm acoustic wave resonator of the plurality of parallel-arm acoustic wave resonators being connected between the node and the ground, and a single series-arm acoustic wave resonator of the plurality of series-arm acoustic wave resonators being connected between the node and the output, the acoustic wave filter including a coupled bulk acoustic wave resonator connected between the first and second capacitors and including a first acoustic wave element having a first signal terminal coupled to the first capacitor, a second acoustic wave element having second signal terminal coupled to the second capacitor, and a ground terminal, the coupled bulk acoustic wave resonator further including a piezoelectric film disposed between the first and second signal terminals and the ground terminal, the first capacitor being integrally formed with the coupled bulk acoustic wave resonator and including a portion of a conductive trace forming an upper electrode of the first acoustic wave element and a lower plate separated from the conductive trace by a layer of dielectric material, the lower plate being laterally displaced from the piezoelectric film.

8. The filtering circuit of claim 7 wherein each series-arm acoustic wave resonator and each parallel-arm acoustic wave resonator is a bulk acoustic wave resonator.

9. The filtering circuit of claim 8 wherein each bulk acoustic wave resonator is one of a film bulk acoustic resonator and a solidly mounted resonator.

10. The filtering circuit of claim 7 wherein the first and second acoustic wave elements of the coupled bulk acoustic wave resonator are film bulk acoustic wave resonators.

11. The filtering circuit of claim 7 wherein the second capacitor is integrally formed with the coupled bulk acoustic wave resonator.

12. The filtering circuit of claim 7 wherein the second capacitor is formed from a portion of a conductive trace forming an upper electrode of the second acoustic wave element and a lower plate separated from the conductive trace by a layer of dielectric material.

13. A filtering circuit comprising:
a primary filter including a plurality of primary acoustic wave resonators constructed and arranged to provide the primary filter with a passband and a stopband, the plurality of primary acoustic wave resonators including a plurality of series-arm acoustic wave resonators connected in series along a signal path between an input of the filtering circuit and an output of the filtering circuit, and a plurality of parallel-arm acoustic wave resonators connected between the signal path and a ground; and a loop circuit including a first capacitor, a second capacitor, and an acoustic wave filter connected in series between the first capacitor and the second capacitor, the first capacitor connected to a first node of the primary filter, the second capacitor connected to a second node of the primary filter that is different than the first node, the acoustic wave filter including a coupled bulk acoustic wave resonator connected between the first and second capacitors and including a first acoustic wave element having a first signal terminal coupled to the first capacitor, a second acoustic wave element having second signal terminal coupled to the second capacitor, and a ground terminal, the coupled bulk acoustic wave resonator further including a piezoelectric film disposed between the first and second signal terminals and the ground terminal, the loop circuit being configured to attenuate a portion of a signal in the stopband of the primary filter by signal phase cancellation, the first capacitor being integrally formed with the coupled bulk acoustic wave resonator and including a portion of a conductive trace forming an upper electrode of the first acoustic wave element and a lower plate separated from the conductive trace by a layer of dielectric material, the lower plate being laterally displaced from the piezoelectric film.

14. The filtering circuit of claim 13 wherein the first node is the input of the primary filter and the second node is the output of the primary filter.

15. The filtering circuit of claim 13 wherein the first node is the input of the primary filter, a first parallel-arm acoustic wave resonator of the plurality of parallel-arm acoustic wave resonators is connected between the second node and the ground, and at least one series-arm acoustic wave resonator of the plurality of series-arm acoustic wave resonators is connected between the second node and the output of the primary filter.

16. The filtering circuit of claim 13 wherein each of the primary acoustic wave resonators is one of a film bulk acoustic resonator and a solidly mounted resonator.

* * * * *